United States Patent
Jennion et al.

(10) Patent No.: US 6,530,069 B2
(45) Date of Patent: Mar. 4, 2003

(54) PRINTED CIRCUIT BOARD DESIGN, TESTING, AND MANUFACTURING PROCESS

(75) Inventors: Mark W. Jennion, Chester Springs, PA (US); Christina B. Kettlety, Oxford, PA (US); Anthony P. Gold, Exton, PA (US)

(73) Assignee: Unisys Corporation, Blue Bell, PA (US)

(*) Notice: Subject to any disclaimer, the term of this patent is extended or adjusted under 35 U.S.C. 154(b) by 140 days.

(21) Appl. No.: 09/725,389

(22) Filed: Nov. 29, 2000

(65) Prior Publication Data

US 2002/0066068 A1 May 30, 2002

(51) Int. Cl.$^7$ .............................................. G06F 17/50
(52) U.S. Cl. ............................................ 716/15; 716/18
(58) Field of Search ............................ 716/1–2, 11–16, 716/18

(56) References Cited

U.S. PATENT DOCUMENTS

| | | | |
|---|---|---|---|
| 5,537,580 A | * 7/1996 | Giomi et al. | 716/18 |
| 5,726,902 A | * 3/1998 | Mahmood et al. | 716/12 |
| 5,801,958 A | * 9/1998 | Dangelo et al. | 716/18 |
| 6,021,266 A | * 2/2000 | Kay | 716/1 |
| 6,145,117 A | * 11/2000 | Eng | 716/18 |
| 6,182,268 B1 | * 1/2001 | McElvain | 716/1 |
| 6,321,369 B1 | * 11/2001 | Heile et al. | 716/11 |

\* cited by examiner

Primary Examiner—Matthew Smith
Assistant Examiner—Paul Dinh
(74) Attorney, Agent, or Firm—Woodcock Washburn Kurtz Mackiewicz & Norris LLP; Lise A. Rode; Mark T. Starr

(57) ABSTRACT

The invention provides a method, system, and computer-readable medium having computer-executable instructions for designing a PCB using both HDL design elements and schematic design elements. The inventive method comprises the steps of selecting the HDL design elements and selecting the schematic design elements. The inventive method further comprises automatically interconnecting the HDL design elements, and automatically interconnecting the schematic design elements. The PCB is then physically designed based on the interconnected HDL and schematic design elements. The method may further comprise creating a schematic version from the interconnected HDL design elements, and creating a HDL version from the interconnected schematic design elements. The inventive method also may simulate the schematic version of the HDL design elements, and simulate the HDL version of the schematic design elements. In either case, the non-logic portions of the HDL version and the schematic version are automatically removed before the simulation.

9 Claims, 5 Drawing Sheets

PRINTED CIRCUIT BOARD DESIGN, TESTING, AND MANUFACTURING PROCESS

FIELD OF THE INVENTION

The invention relates to the field of printed circuit board (PCB) design. More specifically, the invention relates to designing PCBs using a method and system that accepts both textual and graphical inputs.

BACKGROUND OF THE INVENTION

Currently there are two common design entry techniques for accomplishing PCB design: text based such as Very High Speed Integrated Circuits Hardware Description Language VHDL) Verilog and manual graphic-based schematic entry. In the proceeding text, VHDL will be used to refer to both VHDL and Verilog text-based design entry. Both techniques (text and graphic) offer distinct advantages, and present corresponding inherent disadvantages. For example, VHDL aids a designer by allowing simulation of the PCB prior to manufacture, while schematic entry allows the designer to design both logic and non-logic PCB components. To date, however, there is no single PCB design process that captures both VHDL and schematic entry data. As a result, designers often are restricted to using either VHDL or schematic entry, or adopting two independent and redundant design processes for the same circuit board (i.e., one for VHDL and the other for schematic entry). This limitation prevents the PCB designer from using the benefits of VHDL and schematic entry to design the same board, for example. In many applications, the ability to use such a combination of techniques for one board would provide a faster and more efficient PCB design process.

FIG. 1 is a flowchart showing one example of a prior art PCB design method 100. Significantly, design method 100 comprises two independent methods: VHDL entry beginning at step 103, and graphical schematic entry beginning at step 109. First, for the VHDL entry method, in step 103, the designer creates VHDL only for the logic design elements of the PCB. In step 104, the designer enters the VHDL into a semi-automated VHDL interconnect program. The semi-automated VHDL interconnect program outputs an HDL Netlist, in step 105. Those skilled in the art will appreciate that, generally speaking, a Netlist comprises a list of physical circuit components, along with the interconnections between those components. Thus, a Netlist defines the interconnections between all functional elements in a physical circuit. By simulating the operation of the physical circuit represented by the Netlist, the proper operation of the entire physical circuit can be verified prior to fabrication of the PCB.

In step 106, the designer manually enters any non-automated interconnections. In step 107, both non-automated interconnections and the HDL Netlist (which includes the automated connections) are run through a simulation program. In step 108, the output of the simulation program is reviewed by the designer to decide whether the simulation is satisfactory. If the designer is not satisfied with the simulation output, the VHDL may be revised and recreated and returned to step 103 to begin the process anew. If, on the other hand, the designer is satisfied with the simulation output, the designer may determine whether to create a graphical schematic, in step 111. In step 109, the graphical schematic is created manually from the knowledge gained from the VHDL entry process. The line between steps 109 and 111 is shown dashed because the designer can not use the output of the simulation program from step 107 to automatically create schematics in step 109. Instead, the designer simply takes the confidence and experience gained through the VHDL entry method beginning at step 103, and creates a graphical schematic entry in step 109. If the designer does not wish to create a schematic version of VHDL entry, the PCB may be manufactured in step 112.

Alternatively, the designer may begin PCB design method 100 at step 109. In this instance, the designer first manually creates graphical schematics that include both logic and non-logic PCB components. As discussed, these graphical schematics may be either the first step in the design process (at step 109), or may follow the VHDL entry method (after step 111 as described above). In either case, the designer creates the schematic entry anew. In step 110, the graphical schematic entry is entered into design software, for example PCB design software, commercially available as DESIGN ARCHITECT from MENTOR GRAPHICS. The designer may then use the output of PCB design software to manufacture the PCB, in step 113.

There are many disadvantages associated with prior art method 100. For one, with the schematic entry method (beginning at step 109), logic and non-logic portions of the PCB design are entered into the design software, in step 110, without undergoing simulation. A second disadvantage results from the inability to translate automatically the logic portions of the VHDL entry method (beginning at step 103) into the schematic entry method (beginning at step 109). A third disadvantage is that simulation step 107 in the VHDL entry method permits designers to become inattentive to programming efficiency concerns. In other words, designers who use schematic entry method (i.e., begin at step 109) tend to produce more efficient designs than those who use VHDL entry method (i.e., begin at step 103), because of simulation step 107. There are, on the other hand, certain advantages associated with prior art method 100. For one, the simplicity of prior art method 100 permits easier adaptation to changes in design requirements, simulation software, and PCB design software.

FIG. 2 is a flowchart showing a second example of a prior art PCB design method 200. Significantly, and unlike prior art PCB design method 100 as discussed with reference to FIG. 1, design method 200 allows VHDL entry of both logic and non-logic design elements, in step 201. After the designer creates VHDL for logic and non-logic design elements in step 201, the VHDL is entered into a semi-automated interconnect program in step 202. In step 203, the interconnect program creates a HDL Netlist, while the VHDL simultaneously is loaded into a file-mapping software in step 212. The file-mapping software is a physical to logical map file program that converts the interconnected VHDL into, for example, a MENTOR GRAPHICS-specific file format, for later use in step 207.

HDL Netlist obtained from step 203 is entered into a simulation program in step 204. However, because only the logic element portions of HDL Netlist can be simulated, the designer must hide (i.e., "rem") the non-logic portions from the simulator. However, the non-logic portions can not be completely removed from the Netlist because they are relevant for later use in design method 200. In step 205, the designer decides whether the simulation is satisfactory. If the designer is not satisfied with the results of simulation program from step 204, the VHDL may be revised, recreated and returned to step 201 to begin the process anew. If, on the other hand, the designer is satisfied with the results of simulation program 204, the program is entered into a translator software program, for example, SYNOPSYS INTERFACE FILE FORMAT (SIFF) software, available from SYNOPSYS, Incorporated.

In step 207, the translator software converts the VHDL into a format acceptable to the PCB design software, for example MENTOR GRAPHICS software. At this point, in step 208, the designer reviews the output of the PCB design software to determine if the output is satisfactory. If the designer is not satisfied with the results of the PCB design software in step 208, the program may be returned to step 206 and reentered in the translator software. If, on the other hand, the designer is satisfied with the results of the PCB design software, the designer determines whether improved, more "readable" schematics are desired in step 209. If improved schematics are desired, the designer undergoes a manually intensive effort in step 210 to provide more "readable" schematics. If, on the other hand, improved schematics are not desired the designer may use the output of the PCB design software to manufacture the PCB, in step 211.

As with prior art method 100 discussed with reference to FIG. 1, there are many disadvantages associated with prior art method 200. For one, although prior art method 200 captures non-logic design concerns as well as logic concerns, it is more complicated than prior method 100. Yet, the non-logic portion must be hidden manually (e.g., "remed") before the design can be entered into the simulator program, in step 204. Therefore, simulation is more complicated and time-consuming. In addition, in comparison to prior art method 100, prior art method 200 requires an additional step before entering the PCB design software. In particular, the logic portion of the VHDL and the logic and non-logic portions of the schematic entry must be passed through the translator software. Finally, the overall additional complexity of prior art method 200 makes it more resistant to the inevitable design and software changes that arise. Moreover, because prior art method 200 relies on independent commercially-available software products (e.g., SIFF, simulation software, and file mapping software), any software change to one product often requires the difficult coordination of numerous other products made by different vendors.

Therefore, there is a need to permit designers to utilize both VHDL entry and schematic entry techniques in the creation of one PCB without the unnecessary redundancy found in existing design methods.

SUMMARY OF THE INVENTION

In view of the above-mentioned limitations in the prior art, the invention provides a method, system, and computer-readable medium having computer-executable instructions for designing a PCB using both HDL design elements and schematic design elements, and for designing, simulating and formally verifying a PCB using both VHDL and schematic entry techniques. In particular, the inventive method comprises the steps of selecting the HDL design elements and selecting the schematic design elements. The inventive method further comprises automatically interconnecting the HDL design elements, and automatically interconnecting the schematic design elements. The PCB is then physically designed based on the interconnected HDL and schematic design elements. The method may further comprise creating a schematic version from the interconnected HDL design elements, and creating a HDL version from the interconnected schematic design elements. The inventive method also may simulate the schematic version of the HDL design elements, and simulate the HDL version of the schematic design elements. In either case, the non-logic portions of the HDL version and the schematic version may be automatically removed prior to simulating.

A system for designing a PCB using HDL design elements and schematic design elements. The system includes a HDL interconnect component for automatically interconnecting inputted VHDL logic design elements, and a simulation component in communication with the HDL interconnect component. The simulation component simulates the VHDL logic design elements. The inventive system further includes a design capture component in communication with the HDL interconnect component and the simulation component. The design capture component receives logical and non-logical graphical device inputs. Also, the system includes a physical design component in communication with the design capture component. The physical design component designs electrical paths between the logical graphical device inputs. The inventive system further may include a HDL logic import component in communication with the HDL interconnect component and the simulation component, and an interface component in communication with the HDL logic import component and the design capture component. The interface component and the HDL logic import component convert the inputted VHDL to a form compatible with the design capture component. The system also may include a HDL logic export component in communication with the design capture component and the HDL interconnect component. The HDL logic export component converts the VHDL to a form compatible with the simulation environment.

BRIEF DESCRIPTION OF THE DRAWINGS

A system and method for designing a PCB in accordance with the invention is further described with reference to the accompanying drawings in which.

DETAILED DESCRIPTION OF THE INVENTION

Figure 1:
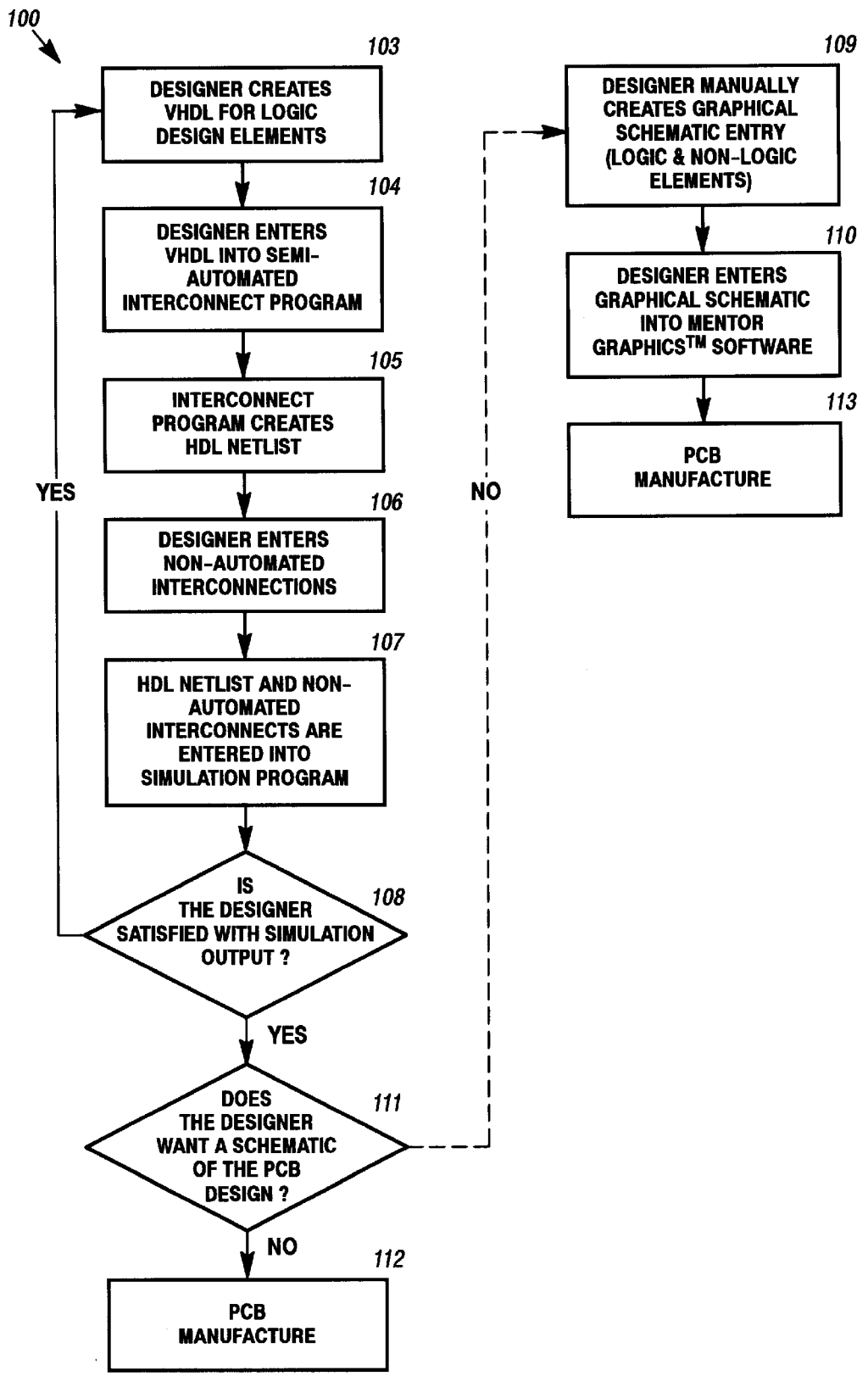
FIG. 1 is a flowchart of a prior art method for designing a PCB using two independent methods for VHDL logic entry and schematic logic and non-logic entry techniques.
Figure 2:
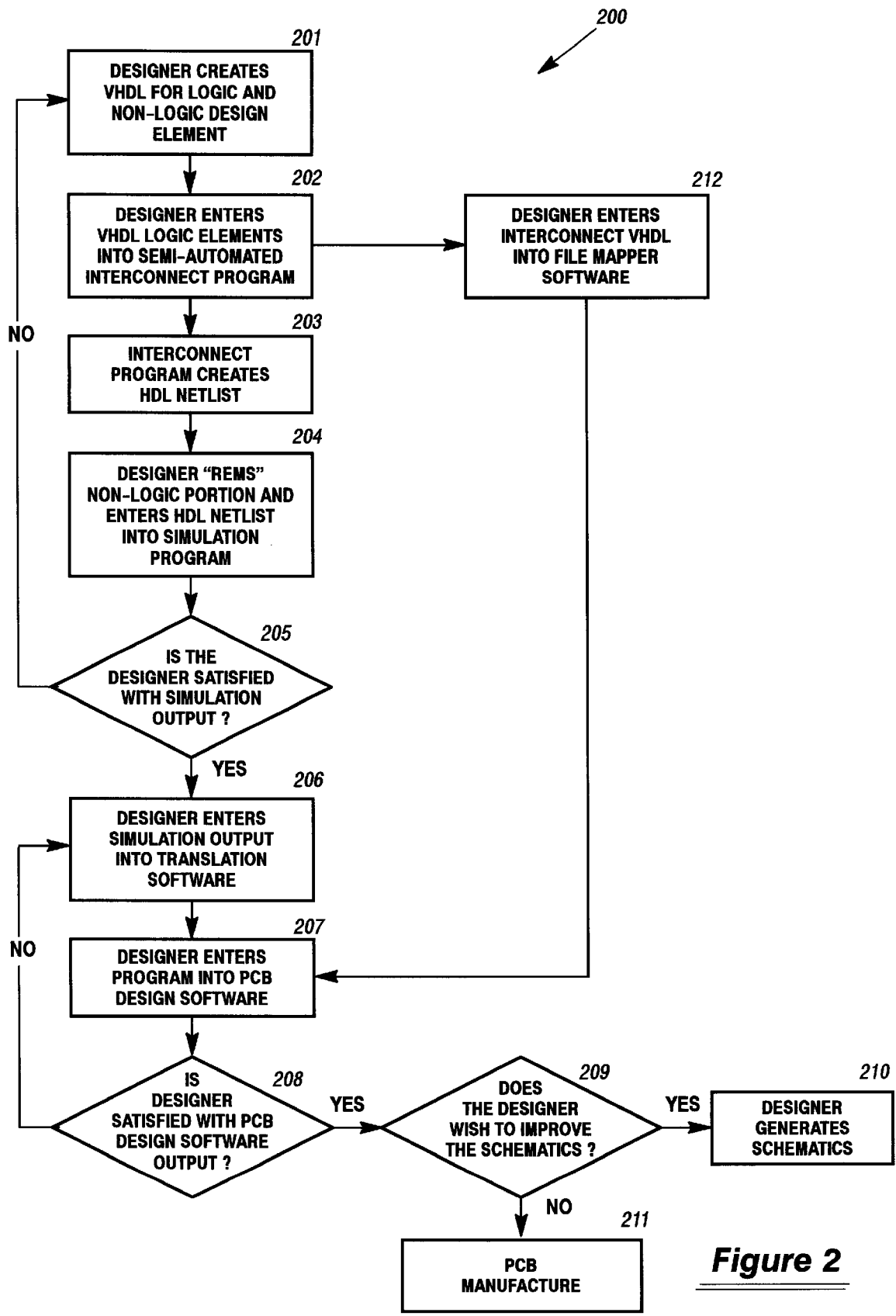
FIG. 2 is a flowchart of another prior art method for designing a PCB using VHDL logic and non-logic entry techniques.
Figure 3:
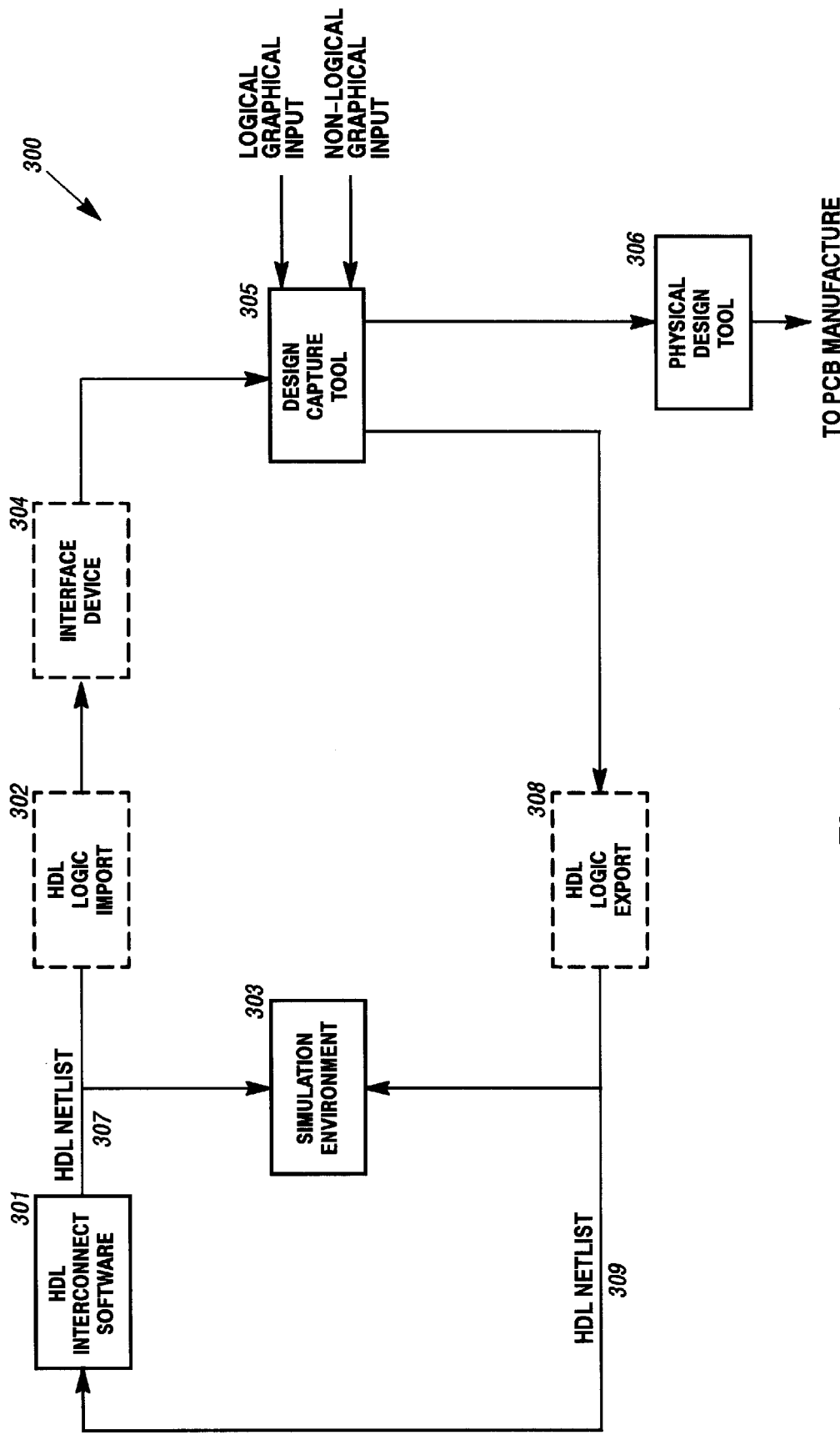
FIG. 3 is a block diagram of a system for designing a PCB using VHDL logic entry and schematic logic and non-logic entry techniques, according to the invention.

FIG. 3 is a block diagram of a PCB design system 300, according to the invention. As shown in FIG. 3, an HDL interconnect software 301 is coupled to an HDL logic import software 302. HDL interconnect software 301 is used to automatically interconnect VHDL logic design elements inputted into the software (or like code files describing the logic design of a PCB). HDL interconnect software 301 may be a commercially available application specific integrated circuit (ASIC) evaluation tool, for example COMPONENT LEVEL INTERCONNECT (CLIC), available from CADENCE Corporation.

CLIC software provides a custom graphic user interface to write "syntax correct" VHDL for the interconnection of predefined components and/or entities, or newly created entities. In particular, a designer inputs the required net name and corresponding vector sizes. CLIC then provides a file that automatically places the proper delimiters and text required by other VHDL tools, instead of requiring the designer to use an editor that may be prone to typographical/syntax errors. In this way it automates the creation of instance names, component instantiations, component statements, signal statements, and vector statements, while ensuring correct punctuation. CLIC also has a "pattern connect" feature that permits the connection of nets in the Netlist to ports, based on text patterns in the net names. For example, one may connect all nets that end with "_TRM" to a port A of a resistor.

It has been shown that an ASIC evaluation tool may be used to evaluate systems of electronic components such as circuit board assemblies, backplanes, chassis, and racks, for example. To interconnect VHDL logic design elements or other higher level system of electronic components, the designer uses information learned from the ASIC evaluation and combines this information with additional data corresponding to the other components that form the system. The combined data is formatted into a format the ASIC evaluation tool understands. In this way, the ASIC evaluation tool is "tricked" into believing that it is evaluating and interconnecting an ASIC when, in reality, it is evaluating a system of electronic components, such as VHDL logic design elements on a circuit board. This process of "tricking" the ASIC evaluation is more fully described in application Ser. No. 09/285,031 (Attorney Docket Number USYS-0054/TN 132), filed on Apr. 1, 1999, and incorporated herein by reference. ASICs are usually written at a higher level VHDL, called Register Transfer-level (RTL). The RTL later is synthesized into individual gates. However, the whole ASIC is not synthesized at one time. Instead, the RTL VHDL is divided into multiple hierarchy levels of modules (i.e., smaller functional blocks) and synthesized individually. These modules then must be connected together manually using an editor or custom UNIX script. Similarly, CLIC can not output synthesizable VHDL, it can only output structured VHDL. However, instead of manually using the editor, as described above for ASIC, CLIC may be used to provide a faster and more reliable means for connect the modules together.

HDL interconnect software 301 is further coupled to a simulation environment 303. HDL interconnect software 301 provides HDL Netlist 307 to simulation environment 303 and to HDL logic import 302. Simulation environment 303 simulates logic design elements only. HDL logic import software 302 may be coupled to an interface device 304. Interface device 304 is coupled to a design capture tool 305. Interface device 304 converts the HDL to a form suitable for inputting to design capture tool 305. Design capture tool 305 provides the logical interconnect as in a graphical schematic. Design capture tool 305 may be one of a number of commercially available products including, for example, CONCEPT-HDL, available from CADENCE Corporation. Design capture tool 305 is capable of receiving logic and non-logic graphical schematic elements.

HDL Logic Import 302 and Interface device 304 are shown dashed, indicating that they are optional devices. HDL Logic Import 302 and Interface device 304 may be used if it is desired to convert the HDL to a format consistent with design capture tool 305. In this case, the non-logical graphical input will be used. If, on the other hand, HDL Logic Import 302 and Interface device 304 are not used, then both logical and non-logical graphical input will be used. In this case, the design is simulated by simulation software 303 and then recaptured via the graphical input. The user may then chose to export the design and re-simulate to ensure equivalence.

Design capture tool 305 is coupled to a physical design tool 306. Physical design tool 306 provides the physical trace in a PCB that connects the physical components. Physical design tool 306 may be one of a number of commercially available products including, for example, ALLEGRO EXPERT SYSTEM, available from CADENCE Corporation.

Design capture tool 305 may be further coupled to a HDL logic export software 308. HDL logic export software 308 is required to add module or subsystem uniqueness back into the HDL. In particular, HDL logic export software 308 returns top level (i.e., module to module interface) HDL to the previous naming conventions of the HDL that existed before it entered design capture tool 305. HDL logic export software 308 also may add and/or change various statements in the HDL to comply with the syntax requirements (e.g., syntax and header statements) of simulation environment 303. HDL logic export software 308 is shown dashed, indicating that it is an optional device.

HDL logic export software 308 may be used if it is desired to re-simulate the output of design capture tool 305. For example, HDL logic export software 308 and HDL Netlist 309 may be used when HDL Logic Import 302 and Interface device 304 are not used (i.e., when there is a completely recaptured design). Also, for example, HDL logic export software 308 and HDL Netlist 309 may be used even when HDL Logic Import 302 and Interface device 304 are used, but when a significant amount of logical graphical input was added to the overall design. Typically, however, if HDL Logic Import 302 and Interface device 304 are used to input a previously simulated design, HDL logic export software 308 may not be needed to re-simulate because of the low risk of logical error.

HDL logic export software 308 is then coupled to simulation environment 303 and HDL interconnect software 301. HDL logic export software 308 provides HDL Netlist 309 to simulation environment 303 and HDL interconnect software 301. If HDL logic export software 308 is not required, design capture tool 305 will be directly coupled to simulation environment 303 and HDL interconnect software 301.

Figure 4A:
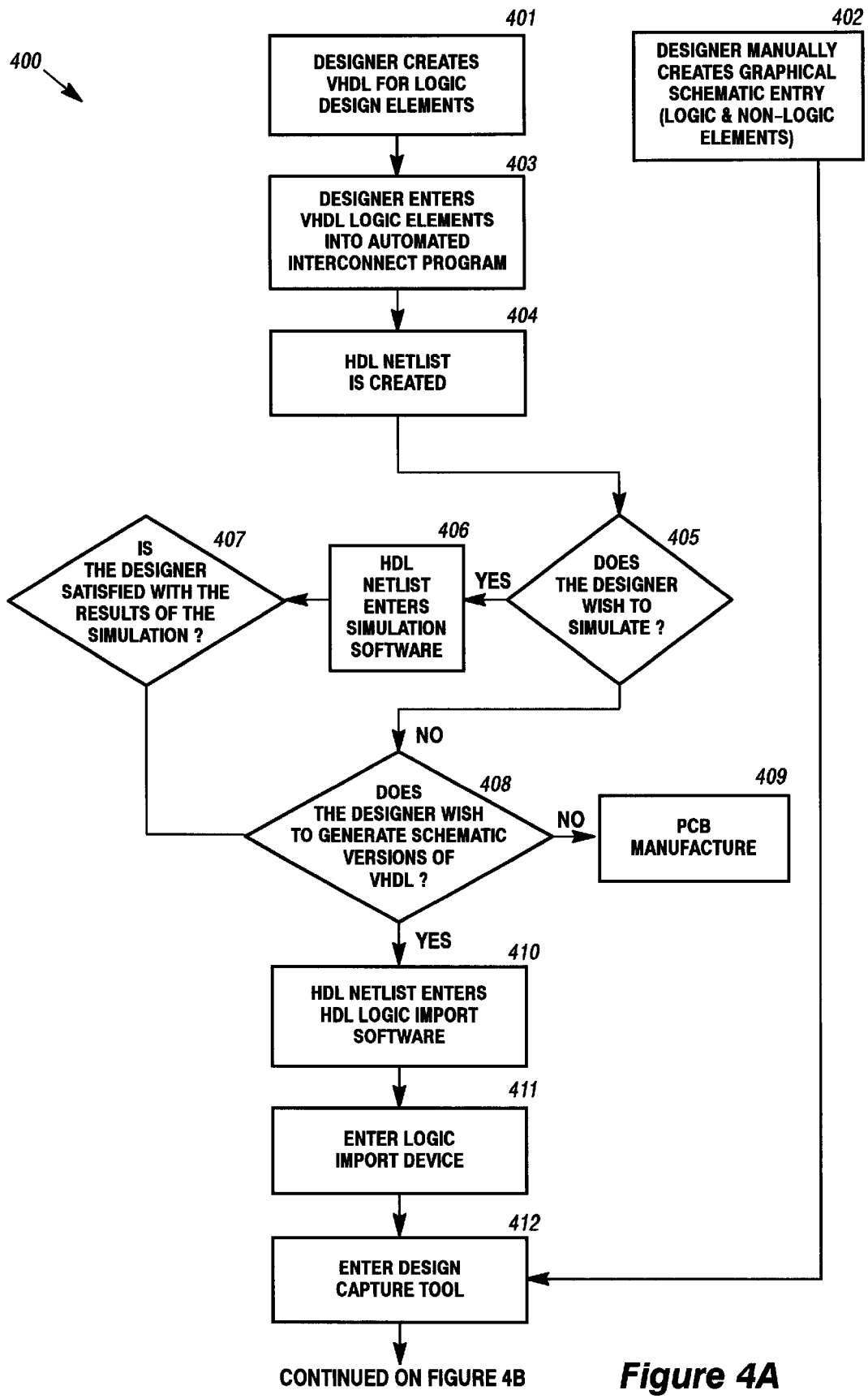
FIGS. 4A and 4B provide a flowchart of a method for designing a PCB using VHDL logic entry and schematic logic and non-logic entry techniques, according to the invention.
Figure 4B:
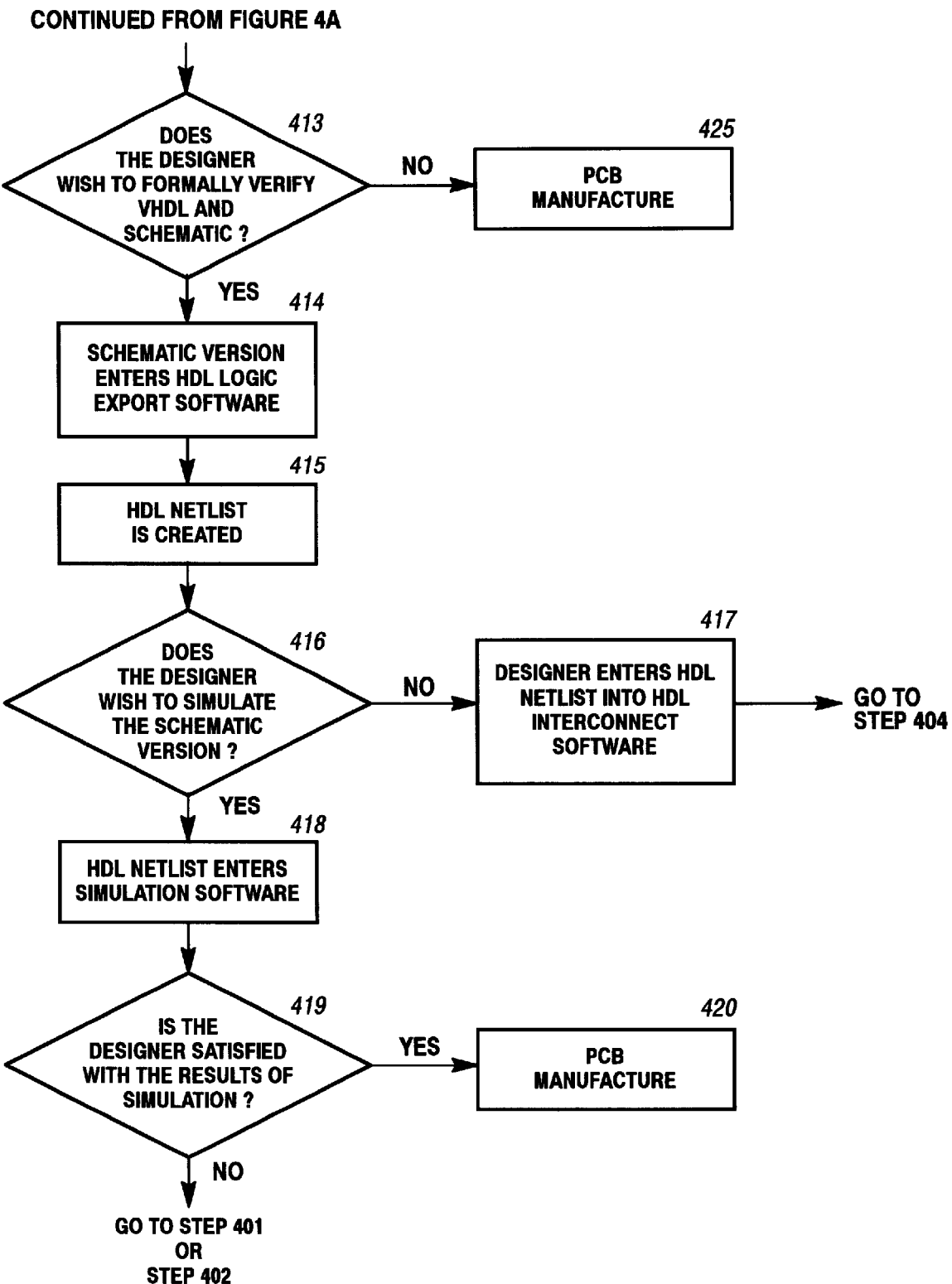

FIGS. 4A and 4B provide a flowchart of a method 400 for designing a PCB using VHDL logic entry and schematic logic and non-logic entry techniques according to the invention. In method 400, the designer may begin either by creating VHDL for logic design elements of the PCB design, in step 401, or by creating graphical schematic entry for logic and non-logic design elements of PCB design, in step 402.

Considering first VHDL entry, after creating VHDL for logic design elements of the PCB design in step 401, the designer enters the VHDL into automated HDL interconnect software 301, in step 403. In step 404, HDL Netlist 307 is outputted by automated HDL interconnect program 301. At this point, in step 405, the designer decides whether to simulate. If the designer decides that simulation is appropriate, HDL Netlist 307 enters simulation environment 303, in step 406. Simulation environment 303 simulates logic design elements only. Because this process began at step 401 with the input of VHDL logic design elements only, there is no need to "rem" or hide non-logic elements. In step 407, the designer then determines whether the results of simulation environment 303 are satisfactory. If the simulation results are not satisfactory, the designer returns to step 401 and recreates VHDL for the logic design elements. If, on the other hand, the results of simulation environment 303 are deemed satisfactory, or if the designer did not wish to proceed with simulation in the first instance, the designer proceeds to step 408. In step 408, the designer determines whether it is desirable to create a graphical schematic version of the VHDL entry. The designer may wish to create a graphical schematic version of the VHDL entry in order to formally verify the VHDL entry, by ensuring logical equivalence between the simulated schematic-generated version of the VHDL and the simulated VHDL, as discussed with reference to step 413.

If the designer does not wish to create a schematic version, the design may be passed through design capture tool 305 and physical design tool 306, and be manufactured in step 409. If, on the other hand, the designer wishes to create a schematic version, method 400 proceeds to step 410. In step 410, HDL Netlist 307 enters HDL logic import software 302. The output of logic import software 302 enters interface device 304, in step 411. In step 412, interface device 304 provides an output to design capture tool 305. Notably, if the designer initially chose to begin design method 400 at step 402 with graphical schematic entry, the graphical schematic entry enters design capture tool 305, at step 412.

As shown in FIG. 4B, at this point, the designer determines whether to formally verify the design process, in step 413. Stated differently, the designer decides whether to recreate VHDL from the generated schematic version in order to verify that the two are equivalent. If the designer decides to forego formal verification, HDL Netlist 307 may be entered into physical design tool 306 and manufactured, in step 425. If, on the other hand, the designer decides in step 413 to conduct formal verification, the schematic version, created in step 412 using design capture tool 305, enters HDL logic export software 308, in step 414. As mentioned above, HDL logic export software 308 returns the HDL to the previous naming conventions that existed before it entered design capture tool 305, in step 412. Therefore, HDL logic export software 308 fixes the discrepancies that may exist between the HDL provided by the schematic-entry process, and the HDL required by simulation environment 303.

In step 415, HDL logic export software 308 creates HDL Netlist 309. At this point, in step 416, the designer decides whether to simulate the interconnected graphical schematic represented by HDL Netlist 309. If the designer, does not wish to simulate the schematic version, HDL Netlist 309 enters HDL interconnect software 301, in step 417. Method 400 then proceeds again from step 404. If, on the other hand, the designer wishes to simulate the schematic version, the logic design elements of the schematic entry are entered into HDL logic export software 308. HDL Netlist 309 enters simulation environment 303, in step 418. Notably, HDL logic export software 308 hides (i.e., "rems") the non-logic design elements, contained in HDL Netlist 309, so that it may enter simulation environment 303. In step 419, the designer determines whether the results of simulation environment 303 are satisfactory. If the results of the simulation are satisfactory, HDL Netlist 309 will be passed through physical design tool 306 and the PCB may be manufactured, in step 420. If, on the other hand, the designer determines that the results of the simulation environment 303 are not satisfactory, the designer may begin the design process anew at step 401 or step 402.

Considering next graphical schematic entry, after creating the graphical schematic entry design elements of PCB design in step 402, the designer enters the graphical schematic entry into design capture tool 305, in step 412. Unlike the VHDL logic and the schematic-generated version of the VHDL logic, designer-created graphical schematic entry may contain non-logic elements (i.e., non-simulateable). Design capture tool 305 automates the interconnection between the schematic design elements. The graphical schematic entry enters HDL logic export device 308, in step 414. However, because the designer-entered graphical schematic version contains non-logic elements, these non-logic elements must be hidden or "remmed" by the HDL logic export device 308 in order to be simulated by simulation environment 303. Therefore, HDL Netlist 309 contains logic elements and "remmed" non-logic elements. The remainder of process 400 in steps 416 through 420 proceed in the same fashion as described above.

In sum, the invention provides a system and method for designing a PCB. One feature of the invention is simulating and formally verifying a PCB using both VHDL and schematic entry techniques. It is understood, however, that the invention is susceptible to various modifications and alternative constructions, and that there is no intention to limit the invention to the specific constructions described herein. On the contrary, the invention is intended to cover all modifications, alternative constructions, and equivalents falling within the scope and spirit of the invention.

It should also be noted that the invention may be implemented in a variety of PCB manufacturing systems. The various techniques described herein may be implemented in hardware or software, or a combination of both. Preferably, the techniques are implemented in computer programs executed on programmable computers that each include a processor and a storage medium readable by the processor (including volatile and non-volatile memory and/or storage elements). Program code is applied to data entered using the input device to perform the functions described above and to generate output information. Each program may be implemented in a high level procedural or object-oriented programming language to communicate with a computer system. However, the programs can be implemented in assembly or machine language, if desired. In any case, the language may be a compiled or interpreted language. Each such computer program may be stored on a storage medium or device (e.g., ROM or magnetic diskette) that is readable by a general or special purpose programmable computer for configuring and operating the computer when the storage medium or device is read by the computer to perform the procedures described above. The system also may be implemented as a computer-readable storage medium, configured with a computer program, where the storage medium so configured causes a computer to operate in a specific and predefined manner.

While the invention has been particularly shown and described with reference to the embodiments thereof, it will be understood by those skilled in the art that the invention is not limited to the embodiments specifically disclosed herein. Those skilled in the art will appreciate that various changes and adaptations of the invention may be made in the form and details of these embodiments without departing from the true spirit and scope of the invention as defined by the following claims.

What is claimed is:

1. A method for designing a PCB using HDL design elements and schematic design elements, comprising the steps of:

selecting said HDL design elements;
   selecting said schematic design elements;

automatically interconnecting said HDL design elements;

automatically interconnecting said schematic design elements;

physically designing said PCB based on said interconnected HDL and schematic design elements;

creating a schematic version from said interconnected HDL design elements;

simulating said schematic version of said HDL design elements; and automatically removing non-logic portions of said schematic version before said simulation.

2. The method of claim 1, further comprising creating a HDL version from said interconnected schematic design elements.

3. The method of claim 2, further comprising simulating said HDL version of said schematic design elements.

4. The method of claim 3, further comprising automatically removing non-logic portion of said HDL version before said simulation.

5. A computer-readable medium having computer-executable instructions thereon for:

selecting said HDL design elements;

selecting said schematic design elements;

automatically interconnecting said HDL design elements;

automatically interconnecting said schematic design elements;

physically designing said PCB based on said interconnected HDL and schematic design elements;

creating a schematic version from said interconnected HDL design elements;

simulating said schematic version of said HDL design elements; and automatically removing non-logic portions of said schematic version before said simulation.

6. The computer-readable medium of claim 5, having further computer-executable instructions for creating a HDL version from said interconnected schematic design elements.

7. The computer-readable medium of claim 6, having further computer-executable instructions for simulating said HDL version of said schematic design elements.

8. The computer-readable medium of claim 7, having further computer-executable instructions for automatically removing non-logic portions of said HDL version before said simulation.

9. A system for designing a PCB using HDL design elements and schematic design elements, comprising:

a HDL interconnect component for automatically interconnecting inputted VHDL logic design elements;

a simulation component in communication with said HDL interconnect component, wherein said simulation component simulates the VHDL logic design elements;

a design capture component in communication with said HDL interconnect component and said simulation component, wherein said design capture component receives logical and non-logical graphical device inputs;

a physical design component in communication with said design capture component, wherein said physical design component designs electrical paths between the logical graphical device inputs;

a HDL logic import component in communication with said HDL interconnect component and said simulation component;

an interface component in communication with said HDL logic import component and said design capture component, wherein said interface component and said HDL logic import component convert the inputted VHDL to a form compatible with said design capture component; and a HDL logic export component in communication with said design capture component and said HDL interconnect component, wherein said HDL logic export component converts the VHDL to a form compatible with said simulation environment, and wherein said design capture component supplies Remed non-logic design elements allowing said HDL logic export component to remove non-logic design elements to enable said form compatibility.

* * * * *